United States Patent
Shiu et al.

(10) Patent No.: US 7,205,178 B2
(45) Date of Patent: Apr. 17, 2007

(54) LAND GRID ARRAY PACKAGED DEVICE AND METHOD OF FORMING SAME

(75) Inventors: Hei Ming Shiu, Tsuen Wan (HK); Kam Fai Lee, Tin Shui Wai (HK); Ho Wang Wong, Leung King Estate (HK)

(73) Assignee: Freescale Semiconductor, Inc., Austin, TX (US)

( * ) Notice: Subject to any disclaimer, the term of this patent is extended or adjusted under 35 U.S.C. 154(b) by 206 days.

(21) Appl. No.: 10/807,527

(22) Filed: Mar. 24, 2004

(65) Prior Publication Data

US 2005/0214980 A1    Sep. 29, 2005

(51) Int. Cl.
*H01L 21/00* (2006.01)

(52) U.S. Cl. .............. 438/110; 438/119; 257/723; 257/779; 257/781; 257/782; 257/783; 257/784

(58) Field of Classification Search ........ 257/787–790, 257/723, 734, 737–738, 678, 779, 781–784; 438/124, 126–127, 107–114, 613, 118–119
See application file for complete search history.

(56) References Cited

U.S. PATENT DOCUMENTS

| 5,200,362 | A |  | 4/1993 | Lin et al. |  |
|---|---|---|---|---|---|
| 5,568,363 | A | * | 10/1996 | Kitahara | 361/773 |
| 6,498,099 | B1 |  | 12/2002 | McLellan et al. |  |
| 6,573,121 | B2 |  | 6/2003 | Yoneda et al. |  |
| 2003/0089523 | A1 |  | 5/2003 | Hoffmeyer |  |
| 2003/0090000 | A1 |  | 5/2003 | Caletka et al. |  |
| 2003/0201525 | A1 |  | 10/2003 | James et al. |  |
| 2004/0032013 | A1 | * | 2/2004 | Cobbley et al. | 257/678 |
| 2004/0097081 | A1 | * | 5/2004 | Igarashi et al. | 438/689 |
| 2004/0214372 | A1 |  | 10/2004 | Sakamoto et al. |  |
| 2005/0151235 | A1 | * | 7/2005 | Yokoi | 257/685 |

* cited by examiner

*Primary Examiner*—Zandra V. Smith
*Assistant Examiner*—Thanh Y. Tran
(74) *Attorney, Agent, or Firm*—Charles E. Bergere

(57) ABSTRACT

A method of packaging an integrated circuit die (12) includes the steps of providing a foil sheet (30) and forming a layer of solder (32) on a first side of the foil sheet. A first side of the integrated circuit die is attached to the solder on the foil sheet. The first side of the die has a layer of metal (34) on it and a second, opposing side of the die includes bonding pads (14). The bonding pads are electrically connected to the solder on the foil sheet with wires (16). The die, the electrical connections, and the first side of the foil sheet are encapsulated with a mold compound (20). The foil sheet is separated from the die and the wires, which forms a packaged integrated circuit (10).

19 Claims, 3 Drawing Sheets

LAND GRID ARRAY PACKAGED DEVICE AND METHOD OF FORMING SAME

BACKGROUND OF THE INVENTION

The present invention relates to integrated circuit packaging, and more particularly to an improved process for fabricating a Land Grid Array (LGA) packaged device.

An integrated circuit (IC) die is a small device formed on a semiconductor wafer, such as a silicon wafer. A leadframe is a metal frame that usually includes a paddle that supports the IC die that has been cut from the wafer. The leadframe also has lead fingers that provide external electrical connections. That is, the die is attached to the die paddle and then bonding pads of the die are connected to the lead fingers via wire bonding or flip chip bumping to provide the external electrical connections. Encapsulating the die and wire bonds or flip chip bumps with a protective material forms a package. Depending on the package type, the external electrical connections may be used as-is, such as in a Thin Small Outline Package (TSOP), or further processed, such as by attaching spherical solder balls for a Ball Grid Array (BGA). These terminal points allow the die to be electrically connected with other circuits, such as on a printed circuit board. However, it can be expensive and time-consuming to form a leadframe and package a device if steps like chemical etching and etch back are required.

Virtually all electronic devices use packaged ICs and with the ever present demand for smaller yet more powerful devices, a decrease in the package size is highly desirable. LGA packages offer reduced height by eliminating the solder balls that are part of a ball grid array (BGA) package. Instead of attaching the packaged device to a printed circuit board (PCB) with solder balls, LGA packages are attached to the PCB via a socket. More recently, LGA packages have been reflow-mounted using solder that has been applied to the board. The reduced package height without a decrease in reliability is making LGA packages popular for many electronic devices, such as cellular telephones, digital cameras, personal digital assistants (PDA), etc. Further, LGA packages are able to achieve higher pin counts with smaller packages. At the same time, the electrical path from the IC to the package pad is shortened.

Thus, it would be desirable to have an inexpensive method of fabricating LGA packaged devices.

BRIEF DESCRIPTION OF THE DRAWINGS

The following detailed description of a preferred embodiment of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention provides a method of packaging an integrated circuit die, including the steps of:

providing a foil sheet;

forming a layer of solder on a first side of the foil sheet;

attaching a first side of an integrated circuit die to the solder on the foil sheet, wherein the first side of the die includes a layer of metal thereon and a second, opposing side of the die includes a plurality of bonding pads;

electrically connecting the bonding pads to the solder on the foil sheet with a plurality of wires;

encapsulating the die, the electrical connections, and the first side of the foil sheet with a mold compound; and separating the foil sheet from the die and the plurality of wires, thereby forming a packaged integrated circuit.

In another embodiment of the invention, a plurality of packaged integrated circuits are formed substantially simultaneously using the above-described method by attaching multiple die to the solder on the foil sheet and electrically connecting the multiple die to the solder, encapsulating all of the die, and then, separating the encapsulated die from each other and the foil sheet.

In yet a further embodiment of the invention, a multi-chip module is formed using the above-described method.

Figure 1:
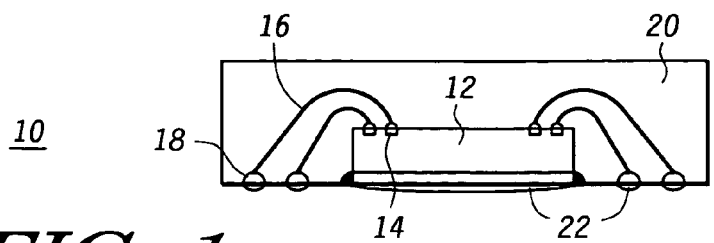
FIG. 1 is an enlarged cross-sectional view of a packaged integrated circuit in accordance with an embodiment of the present invention.

Referring now to FIG. 1, an enlarged cross-sectional view of a packaged semiconductor device 10 formed in accordance with an embodiment of the present invention is shown. The packaged device 10 comprises an integrated circuit die 12, such as one cut from a silicon wafer, having a topside with a plurality of bonding pads 14. The bonding pads 14 have wires 16 attached thereto. More particularly, first ends of the wires 16 are connected to respective ones of the bonding pads 14 and second ends extend to a common plane (package bottom), where balls 18 are formed. As described in more detail below, the balls 18 are formed as part of a wirebonding process. The die 12, the electrical connections, the wires 16, and at least a top portion of the balls 18 are covered or encapsulated with a mold compound 20. The bottom sides of the die 12 and the balls 18 are coated with a thin layer of solder 22 that allows the die 12 and the balls 18 to be connected to a to a printed circuit board (not shown). The balls 18 to which wires 16 are connected are used to pass data, power and ground signals to/from the die 12 and a substrate or printed circuit board, as is known by those of skill in the art. Solder 22 to which the die 12 is attached can conduct heat from the die 12 (i.e., thermal management) and enhance board level solder joint strength.

The integrated circuit die 12 may be any type of circuit, such as a digital signal processor, a special purpose circuit, etc. Such circuits are well known to those of skill in the art. The wires 16 are of a type common to packaged integrated circuits and known to those of skill in the art. The wires 16 are made with an electrically conductive material so that electrical signals can be passed therethrough. The conductive material may be a metal, such as copper or gold, or an alloy thereof and have a diameter of between about 50 to 100 um. Wires made of other materials and of different diameters also may be suitable.

Figure 2A:
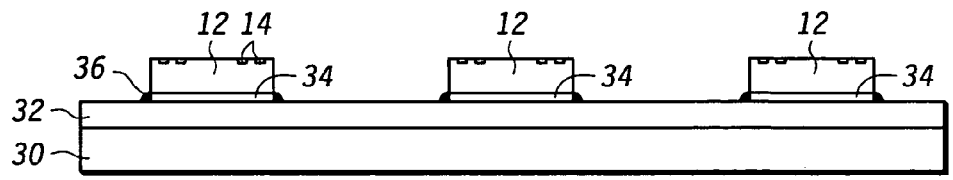
FIGS. 2A–2E are enlarged cross-sectional views illustrating a process of forming a plurality of packaged integrated circuits in accordance with an embodiment of the present invention.
Figure 2B:
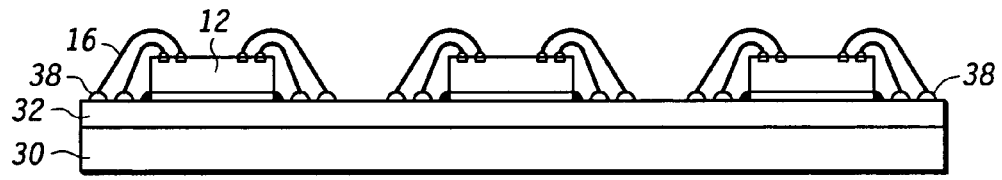
Figure 2C:
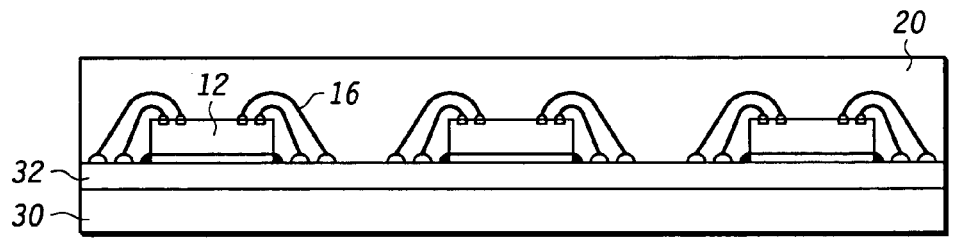
Figure 2D:
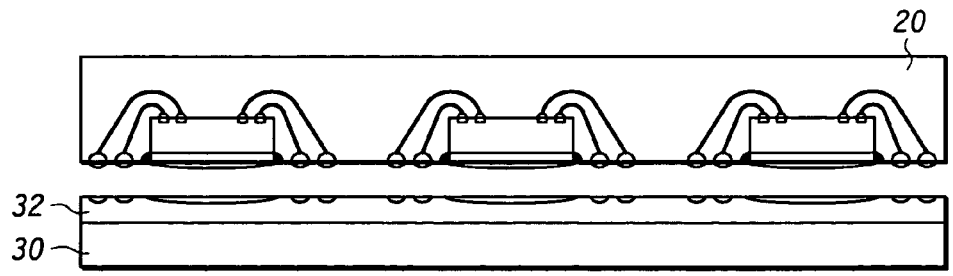
Figure 2E:
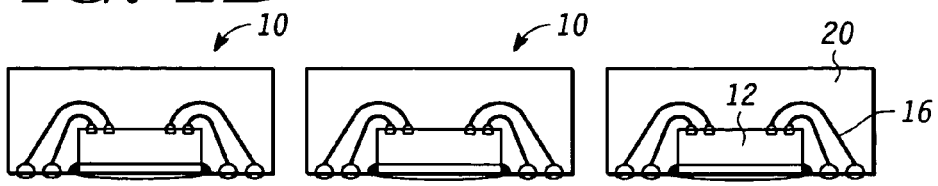
Figure 3:
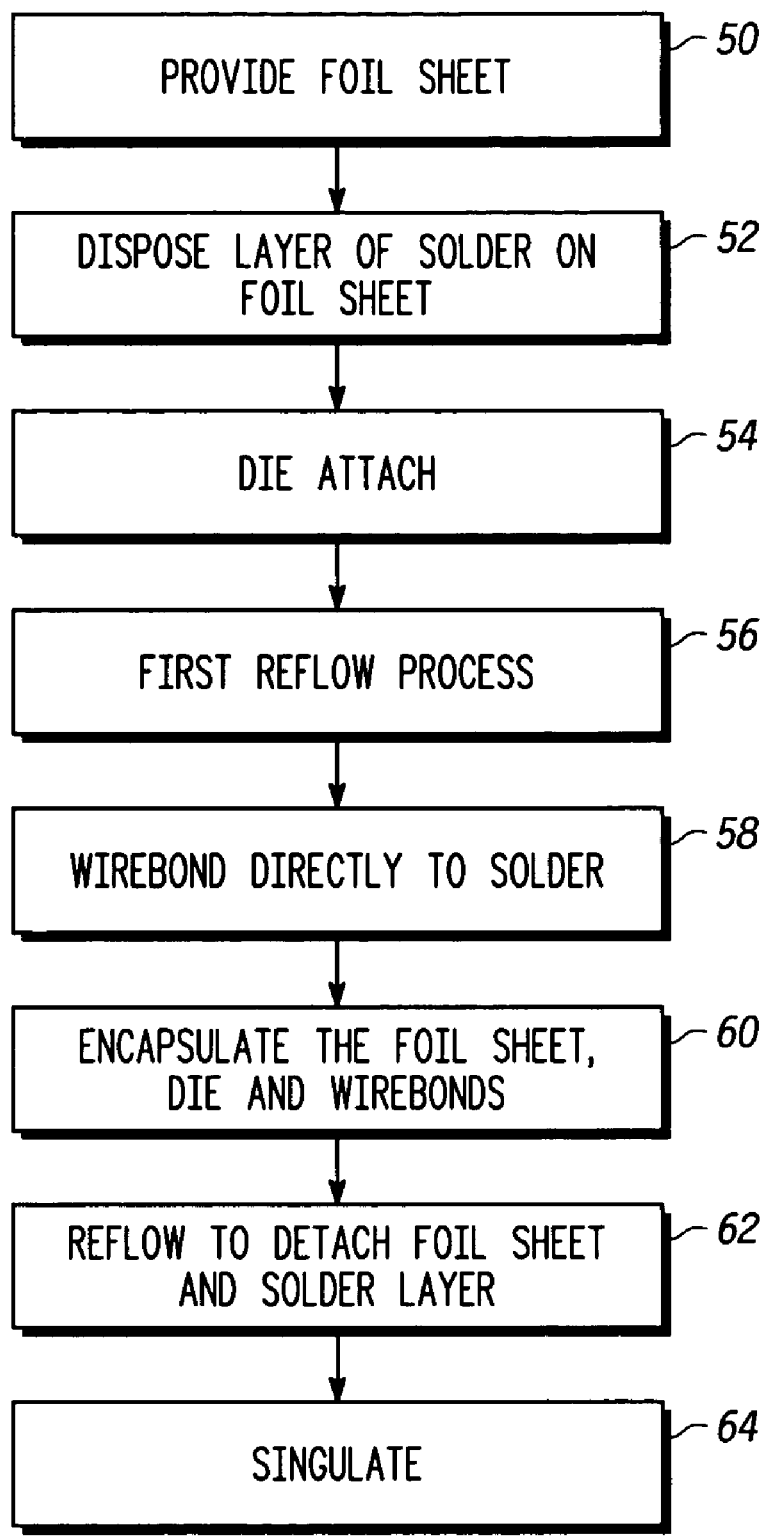
FIG. 3 is a flowchart of a process for forming a packaged integrated circuit in accordance with an embodiment of the present invention.

Referring now to FIGS. 2A through 2E and FIG. 3, a method of forming the packaged device 10 will now be described. FIG. 2A is an enlarged cross-sectional view showing a foil sheet 30 having a layer of solder 32 disposed on a first side of the foil sheet 30. The foil sheet 30 comprises a relatively flat, bare sheet of metal, such as copper or aluminum. Such foil sheets are commercially available and known to those of skill in the art. The layer of solder 32 is formed on the foil sheet 30 by screen printing a layer of high temperature solder paste on the foil sheet 30. The layer of solder 32 has a thickness of about 0.1 mm. The solder 32 preferably is a high temperature solder paste having a reflow temperature in a range from about 250° C. to about 300° C., such as a 97%/2%/1% Pb/Ag/Sn solder with a reflow temperature of about 310° C. By using a stencil, such as a stainless steel stencil, the layer of solder 32 is formed on predetermined areas of the foil sheet 30. In FIG. 3, which is a flow chart of a process for forming a packaged integrated circuit device, step 50 indicates the provision of the foil sheet 30 and step 52 indicates forming the layer of solder 32 on the foil sheet.

One or more integrated circuit die 12 are attached to the foil sheet 30 by way of the solder 32. More particularly, a first side of an integrated circuit die 12 is placed on the layer of solder 32. If the die 12 is placed on the solder 32 before the solder has solidified, then standard pick and place equipment can be used to attach the die 12 to the foil sheet 30. To facilitate attaching the die 12 to the solder 32 on the foil sheet 30, the bottom side of the die 12 includes a layer of metal 34. The metal layer 34 may be applied to the die 12 via backlapping, in which the backside of the wafer is ground down using a wet abrasive under pressure. Then, a metal, such as gold, is deposited on the back of the wafer via sputtering. Such backside metallization is known in the art as it facilitates die attach. The topside of the die 12 includes a plurality of bonding pads 14.

In FIG. 3, the die attach is indicated at step 54. Next, at step 56 a first reflow process is performed in which the foil sheet 30 is passed through a reflow oven. The heat in the oven melts the solder paste 32 and the solder creeps onto the side of the die 12 forming a fillet 36, and securing the die 12 to the foil sheet 30.

Referring now to FIGS. 3 and 2B, after the first reflow process 56 a wirebonding step 58 is performed in which the wires 16 that connect the bonding pads 14 to the foil sheet 30 are attached. The wires 16 electrically connect the bonding pads 14 to the solder 32 on the foil sheet 30. As will be understood by those of skill in the art, the solder 32 has been formed in predetermined locations of the foil sheet 30, such as those locations determined for receiving the die 12 and locations defined for the packaged device 10 inputs and outputs, which in this example are for a land grid array (see FIG. 4). The wirebonding process preferred is a ball bonding process. In a ball bonding process, which is well known, the wire is held in a capillary and an electrical spark (EFO) is used to form a tiny ball at the tip of the wire. In the present invention, the heated tip of a wire 16 is pressed into the solder 32 on the foil sheet 30. Since the tip of the wire 16 is hot, it is soft and thus, a squashed ball 38 is formed on the foil sheet 32. Various gauge wire may be used depending on electrical requirements of the die 12. Typical wire sizes are from about 50 um to about 100 um. For a 75 um gauge wire, a squashed ball bond will have a diameter of about 0.25 mm. Further, since a flat foil sheet is used, the balls 38 have a substantially flat bottom surface. The number of circuit I/O's is used to determine the numbers of wires 16 and balls 38.

After the wirebonding process 58 is performed, the die 12, the electrical connections, the wires 16 and a portion of the balls 38 are encapsulated, preferably with a plastic material, as is known in the art for packaging integrated circuits. FIG. 2C and FIG. 3, step 60 illustrate the encapsulation step in which a mold compound 20 is formed over the die 12, the wires 16 and the tops of the layer of solder 32 and the foil sheet 30. The preferred mold compound 20 is a commonly available epoxy molding compound used in semiconductor packaging. FIG. 2C shows the foil sheet 30 having the encapsulant 20 thereon. At this stage, the encapsulant 20 covers the whole of one side of the foil sheet 30.

After the encapsulation step 60, a second reflow process 62 is performed to separate the foil sheet 30 from the die 12 and the wires 16. FIG. 2D shows the foil sheet 30 and a portion of the layer of solder 32 being separated from the encapsulated die 12 and wires 16. The second reflow process 62 smoothens the solder 32 on the metal foil 30 and weakens an interface between the epoxy mold compound 20 and the metal foil 30, which facilitates detach of the foil sheet 30 from the mold compound 20. It should be noted that a portion of the solder 32 remains attached to the wires 16 and the die 12 after the foil sheet 30 is separated therefrom.

Figure 4:
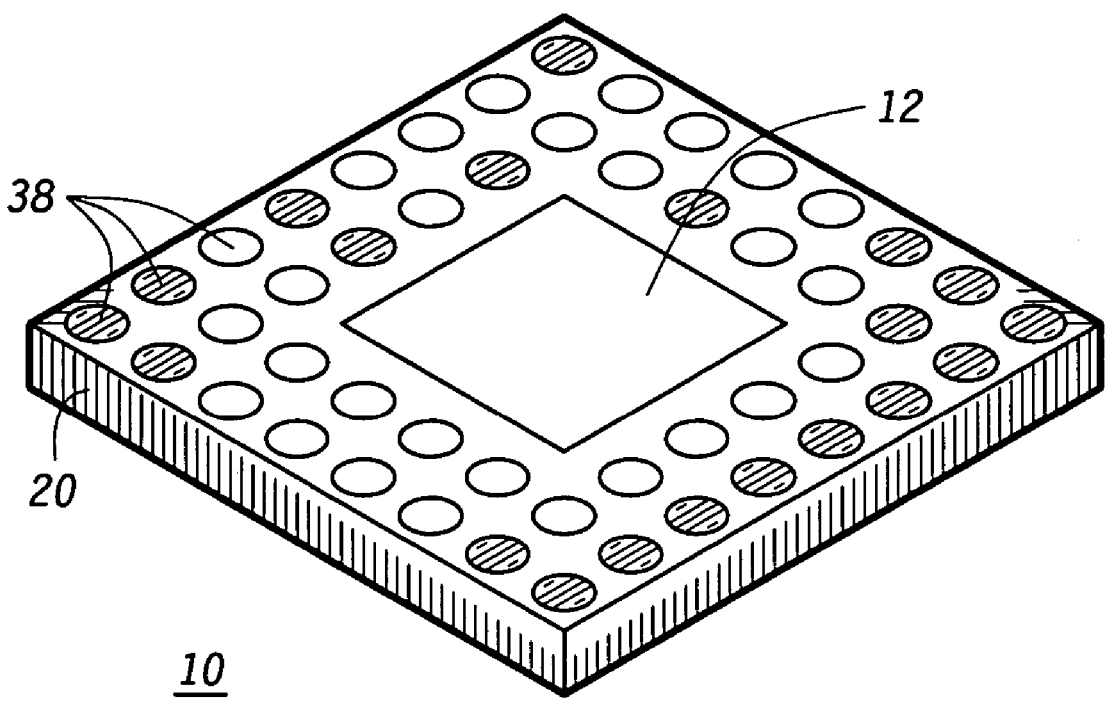
FIG. 4 is an enlarged perspective view showing a bottom side of packaged integrated circuit in accordance with an embodiment of the invention.

As the typical packaging process is to package multiple devices substantially simultaneously, after the foil sheet 32 is detached, the encapsulated die 12 and the wires 16 connected to the respective die are separated from each other such that multiple packaged devices 10 in a singulation step 64. FIG. 2E shows three separate devices 10 after singulation. A well known saw singulation process is preferred. FIG. 4 is an enlarged bottom perspective view of a packaged device 10 formed in accordance with the method of the present invention.

Prior to the saw singulation process 64, an optional electrical functional test may be performed. Since all of the I/O terminals of the encapsulated devices are separated throughout the packaging process, an electrical test in strip format is possible, hence improving tester utilization and making parallel testing possible without additional process or cost.

The packaged device 10 has improved high-frequency electrical performance because the signal path from the IC 12 to the board is shortened. Further, system reliability is improved by increasing solder joint resistance to stress failures caused by deflections of the system board. Improved RF performance and resistance to mechanical stress failures are important issues to cellular telephone handset makers.

Figure 5:
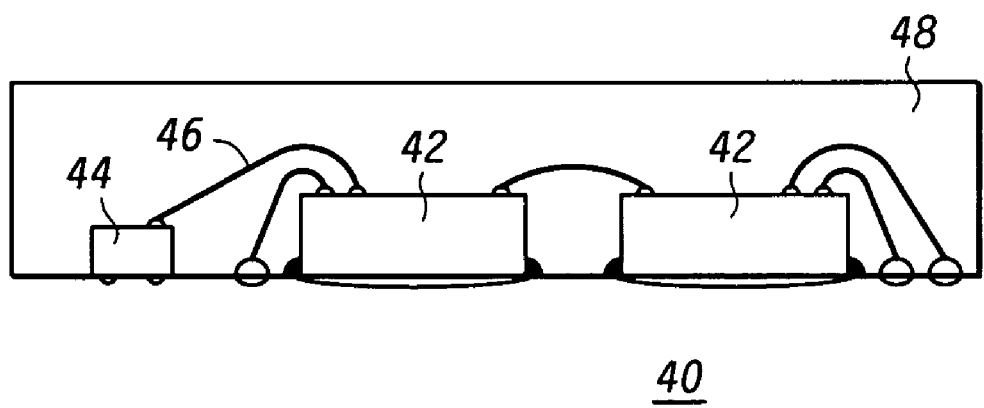
FIG. 5 is an enlarged cross-sectional view of a multi-chip module in accordance with an embodiment of the present invention.

The present invention also can be used to form multi-chip modules (MCM), system in a package (SIP) and stacked die devices. FIG. 5 shows a multi-chip device 40 having two integrated circuits 42 and a passive device 44 formed in accordance with the above-described method. The circuits 42 and the passive device 44 are connected with wires 46. The circuits 42 and 44 and the wires 46 are encapsulated with a mold compound 48. As discussed above, a small amount of the solder remains on the squashed balls formed at the ends of the wires 46 and beneath the circuits 42 and 44.

Although in the embodiments shown, the packaged device is an exposed die type device, the present invention could be applied to a packaged device having a heat sink and the heat sink is exposed. In such a case, the die 12 is attached to one side of a die paddle formed of a metal, such as copper, and the other side of the die paddle is attached to the foil sheet.

The present invention provides an easy and inexpensive method of packaging an integrated circuit. Device cost is low because neither a substrate nor terminations (external pins or balls) are required. Since there is no metal leadframe, the saw blade used in the singulation step does not have to cut through metal, so the saw blade will have a longer life. Also, since no leadframe is required, there is no need to perform substrate trace routing. The packaging process does not require any chemical etch-back, which can be expensive. The packaging process may be performed using currently available equipment. The package also has a very low profile, down to 0.4 mm. Land grid arrays offer high interconnection density, e.g., 200+ I/Os is possible.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

The invention claimed is:

1. A method of packaging an integrated circuit die, comprising the steps of:
   providing a foil sheet;
   forming a single layer of solder on a first side of the foil sheet;
   attaching a first side of an integrated circuit die to the single solder layer on the foil sheet, wherein the first side of the die includes a layer of metal thereon and a second, opposing side of the die includes a plurality of bonding pads;
   electrically connecting the bonding pads to the single solder layer on the foil sheet with a plurality of wires;
   encapsulating the die, the electrical connections, and the first side of the foil sheet with a mold compound; and
   separating the foil sheet from the die and the plurality of wires, thereby forming a packaged integrated circuit.

2. The method of packaging an integrated circuit according to claim 1, wherein the foil sheet comprises a bare metal sheet.

3. The method of packaging an integrated circuit according to claim 2, wherein the metal sheet comprises one of copper and aluminum.

4. The method of packaging an integrated circuit according to claim 1, wherein the solder is formed on the foil sheet via a screen printing process.

5. The method of packaging an integrated circuit according to claim 4, wherein the solder layer has a thickness of about 0.1 mm.

6. The method of packaging an integrated circuit according to claim 1, further comprising performing a first reflow process after the die attach step, wherein the first reflow process melts the solder. thereby securing the die to the foil sheet.

7. The method of packaging an integrated circuit according to claim 1, wherein the plurality of wires are attached to the bonding pads and the solder via a wire bonding process.

8. The method of packaging an integrated circuit according to claim 1, wherein the wirebonding process comprises a ball bonding process.

9. The method of packaging an integrated circuit according to claim 8, wherein the ball bonding process forms squashed ball bonds having a diameter of about 0.25 mm on the foil sheet, wherein said ball bonds function as package terminals.

10. The method of packaging an integrated circuit according to claim 1, wherein the wires have a diameter of about 50 um to about 100 um.

11. The method of packaging an integrated circuit according to claim 1, wherein the foil sheet is separated from the die and the wires via a second reflow process.

12. The method of packaging an integrated circuit according to claim 11, wherein a portion of the solder remains attached to the wires and the die after the foil sheet is separated therefrom.

13. The method of packaging an integrated circuit according to claim 1, wherein the more than one die is attached to the foil sheet, and after the foil sheet is separated from the die and the wires, the die and the wires connected to the respective die are separated from each other such that multiple packaged devices are formed substantially simultaneously.

14. A method of forming a plurality of integrated circuit packages, comprising the steps of:
   providing a sheet of metal foil;
   forming a layer of high temperature solder on a first side of the foil sheet via a screen printing process;
   attaching first sides of a plurality of integrated circuit dies to the single solder layer on the foil sheet, wherein the first side of each of the die includes a layer of metal thereon and a second, opposing side of each of the die includes a plurality of bonding pads;
   performing a first reflow process for securing the plurality of integrated circuit dies to the metal foil;
   electrically connecting the bonding pads to the single solder layer on the foil sheet with a plurality of wires via a wirebonding process, wherein first ends of the wires are attached to the bonding pads and second ends of the wires are attached to the foil sheet;
   encapsulating the integrated circuit dies, the electrical connections, and the first side of the foil sheet with a mold compound;
   separating the foil sheet and the solder layer from the integrated circuit dies, second ends of the plurality -of wires, and the mold compound via a second reflow process, wherein only a portion of the solder layer is removed from the dies and the second ends of the plurality of wires; and
   separating the encapsulated integrated circuit dies and the wires connected thereto from other ones of the encapsulated integrated circuit dies, thereby forming a plurality of packaged integrated circuits.

15. The method of packaging an integrated circuit according to claim 14, wherein-squashed ball bonds having a diameter of about 0.25 mm are formed on the foil sheet, wherein s-aid ball bonds function as package terminals.

16. The method of forming a plurality of integrated circuit packages of claim 14, wherein the separating step comprises the step of saw singulating the encapsulated die from adjacent encapsulated dies.

17. A method of forming a multi-chip module, comprising the steps of:
   providing a sheet of metal foil;
   forming a single layer of high temperature solder on a first side of the foil sheet via a screen printing process;
   attaching first sides of at least two integrated circuit dies to the single solder layer on the foil sheet, wherein the first side of each of the die includes a layer of metal thereon and a second, opposing side of each of the die includes a plurality of bonding pads;

performing a first reflow process for securing the at least two integrated circuit dies to the metal foil;

electrically connecting a first portion of the bonding pads of each of the at least two dies to the single solder layer on the foil sheet with a plurality of first wires via a first wirebonding process, wherein first ends of the first wires are attached to the bonding pads and second ends of the first wires are attached to the foil sheet;

electrically connecting the at least two dies to each other by connecting a second portion of the bonding pads of a first one of the die to a second portion of the bonding pads of a second one of the dies with a plurality of second wires via a second wirebonding process;

encapsulating the at least two integrated circuit dies, the electrical connections, and the first side of the foil sheet with a mold compound; and separating the foil sheet and the solder layer from the at least two integrated circuit dies, second ends of the plurality of first wires, and the mold compound via a second reflow process, wherein only a portion of the solder layer is removed from the at least two dies and the second ends of the plurality of wires.

18. The method of forming a multi-chip module of claim 17, further comprising the steps of:

saw singulating the encapsulated die from adjacent encapsulated dice.

19. The method of forming a multi-chip module of claim 17, further comprising the steps of:

attaching a passive device to the solder on the foil sheet; and electrically connecting the passive device to at least one of the at least two dies, and wherein the passive device is encapsulated with the mold compound.

* * * * *

UNITED STATES PATENT AND TRADEMARK OFFICE
CERTIFICATE OF CORRECTION

| | | |
|---|---|---|
| PATENT NO. | : 7,205,178 B2 | Page 1 of 1 |
| APPLICATION NO. | : 10/807527 | |
| DATED | : April 17, 2007 | |
| INVENTOR(S) | : Hei Ming Shiu et al. | |

It is certified that error appears in the above-identified patent and that said Letters Patent is hereby corrected as shown below:

In Column 6, Line 54, Claim No. 15:
    Change "wherein-squashed" to --wherein squashed--

In Column 6, Line 56, Claim No. 15:
    Change "s-aid" to --said--

Signed and Sealed this

Seventh Day of August, 2007

JON W. DUDAS
*Director of the United States Patent and Trademark Office*